United States Patent
Curello et al.

(10) Patent No.: US 8,741,720 B2
(45) Date of Patent: Jun. 3, 2014

(54) PENETRATING IMPLANT FOR FORMING A SEMICONDUCTOR DEVICE

(71) Applicants: Giuseppe Curello, Portland, OR (US); Ian R. Post, Portland, OR (US); Nick Lindert, Beaverton, OR (US); Walid M. Hafez, Portland, OR (US); Chia-Hong Jan, Portland, OR (US); Mark T. Bohr, Aloha, OR (US)

(72) Inventors: Giuseppe Curello, Portland, OR (US); Ian R. Post, Portland, OR (US); Nick Lindert, Beaverton, OR (US); Walid M. Hafez, Portland, OR (US); Chia-Hong Jan, Portland, OR (US); Mark T. Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/857,578

(22) Filed: Apr. 5, 2013

(65) Prior Publication Data

US 2013/0224926 A1 Aug. 29, 2013

Related U.S. Application Data

(62) Division of application No. 13/107,783, filed on May 13, 2011, now Pat. No. 8,426,927, which is a division of application No. 12/059,455, filed on Mar. 31, 2008, now Pat. No. 7,943,468.

(51) Int. Cl.
*H01L 21/336* (2006.01)

(52) U.S. Cl.
USPC ........... 438/289; 438/142; 438/199; 438/217; 438/302; 438/305; 438/306; 438/307; 438/407; 438/520; 438/528; 438/540; 438/548; 438/918; 257/E21.324; 257/E21.336; 257/E21.443; 257/E21.466; 257/E21.618

(58) Field of Classification Search
USPC ......... 438/142, 199, 217, 289, 302, 305, 306, 438/307, 407, 520, 528, 540, 548, 918; 257/E21.324, E21.336, E21.443, 257/E21.618
See application file for complete search history.

(56) References Cited

U.S. PATENT DOCUMENTS

| | | | |
|---|---|---|---|
| 5,248,627 A | 9/1993 | Williams | |
| 5,372,960 A | 12/1994 | Davies et al. | |
| 5,395,773 A * | 3/1995 | Ravindhran et al. | ......... 438/217 |
| 5,976,938 A | 11/1999 | Gardner et al. | |
| 6,589,847 B1 | 7/2003 | Kadosh et al. | |
| 6,630,385 B1 | 10/2003 | Yu | |
| 2006/0068555 A1 | 3/2006 | Zhu et al. | |

OTHER PUBLICATIONS

International Search Report and Written Opinion from PCT/US2009/038710 mailed Oct. 30, 2009, 10 pgs.
Office Action from German Patent Application No. 11 2009 000 651.5-43 mailed Aug. 8, 2011, 5 pgs.
Office Action from U.S. Appl. No. 12/059,455 mailed Aug. 5, 2010, 9 pgs.

* cited by examiner

*Primary Examiner* — Long K Tran
(74) *Attorney, Agent, or Firm* — Blakely, Sokoloff, Taylor & Zafman LLP

(57) ABSTRACT

A semiconductor device and method to form a semiconductor device is described. The semiconductor includes a gate stack disposed on a substrate. Tip regions are disposed in the substrate on either side of the gate stack. Halo regions are disposed in the substrate adjacent the tip regions. A threshold voltage implant region is disposed in the substrate directly below the gate stack. The concentration of dopant impurity atoms of a particular conductivity type is approximately the same in both the threshold voltage implant region as in the halo regions. The method includes a dopant impurity implant technique having sufficient strength to penetrate a gate stack.

7 Claims, 4 Drawing Sheets

PENETRATING IMPLANT FOR FORMING A SEMICONDUCTOR DEVICE

CROSS-REFERENCE TO RELATED APPLICATIONS

This application is a divisional of U.S. patent application Ser. No. 13/107,783, filed May 13, 2011, which is a divisional of U.S. patent application Ser. No. 12/059,455, filed Mar. 31, 2008, now U.S. Pat. No. 7,943,468, issued May 17, 2011, the entire contents of which are hereby incorporated by reference herein.

TECHNICAL FIELD

Embodiments of the present invention are in the field of Semiconductor Fabrication and, in particular, Semiconductor Devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Another trend in the semiconductor industry is to consider system-on-a-chip type architectures. Such architectures may incorporate, for example, an analog device on the same substrate as a logic device. However, the optimization of one type of device may hamper the optimization of another type of device, often making difficult the incorporation of both types of devices into a single system. Such a dilemma may occur, for example, when optimizing the threshold voltage for each type of device.

DETAILED DESCRIPTION

A penetrating implant for forming a semiconductor device is described herein. In the following description, numerous specific details are set forth, such as specific dimensions, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is to be understood that the various embodiments shown in the Figures are illustrative representations and are not necessarily drawn to scale.

Disclosed herein are a semiconductor device and a method to form a semiconductor device. A gate stack may be disposed on a substrate. In accordance with an embodiment of the present invention, tip regions including dopant impurity atoms of a first conductivity type are disposed in the substrate on either side of the gate stack. Halo regions including dopant impurity atoms of a second conductivity type, opposite the first conductivity type, are disposed in the substrate adjacent the tip regions. A threshold voltage implant region having dopant impurity atoms of the second conductivity type is disposed in the substrate directly below the gate stack. In one embodiment, the concentration of dopant impurity atoms of the second conductivity type in the threshold voltage implant region is approximately the same as the concentration of dopant impurity atoms of the second conductivity type in the halo regions. In accordance with an embodiment of the present invention, implanting the dopant impurity atoms of the second conductivity type to form the halo regions and the threshold voltage implant region is carried out in the same process step and includes penetrating the gate stack with the dopant impurity atoms of the second conductivity type.

The fabrication of a semiconductor device by an implant process that penetrates a gate stack may enable the inclusion of both analog and logic devices on a single substrate, e.g. to form a system-on-a-chip. It may be the case that a process used to fabricate a logic device is undesirable for fabricating an analog device, and vice versa. Thus, in accordance with an embodiment of the present invention, both an analog device and a logic device are included on the same substrate, but the two devices are fabricated by different process operations. In one embodiment, the analog device is fabricated with a penetrating implant process step, while the logic device is not.

Figure 1:
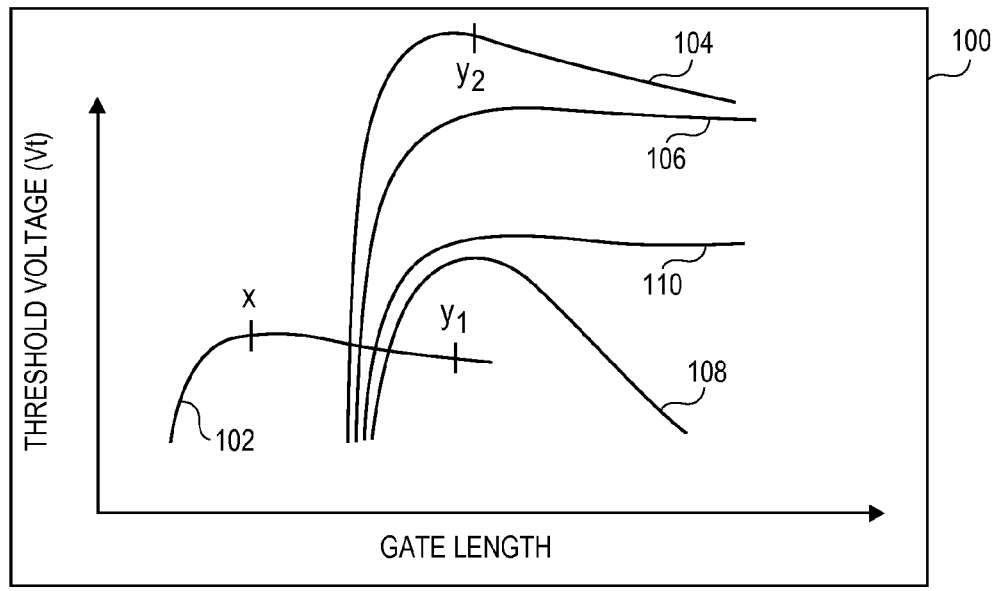
FIG. 1 is a plot of Threshold Voltage (Vt) as a function of Gate Length, and cross-sectional views of corresponding representative semiconductor devices, in accordance with an embodiment of the present invention.
Figure 1:
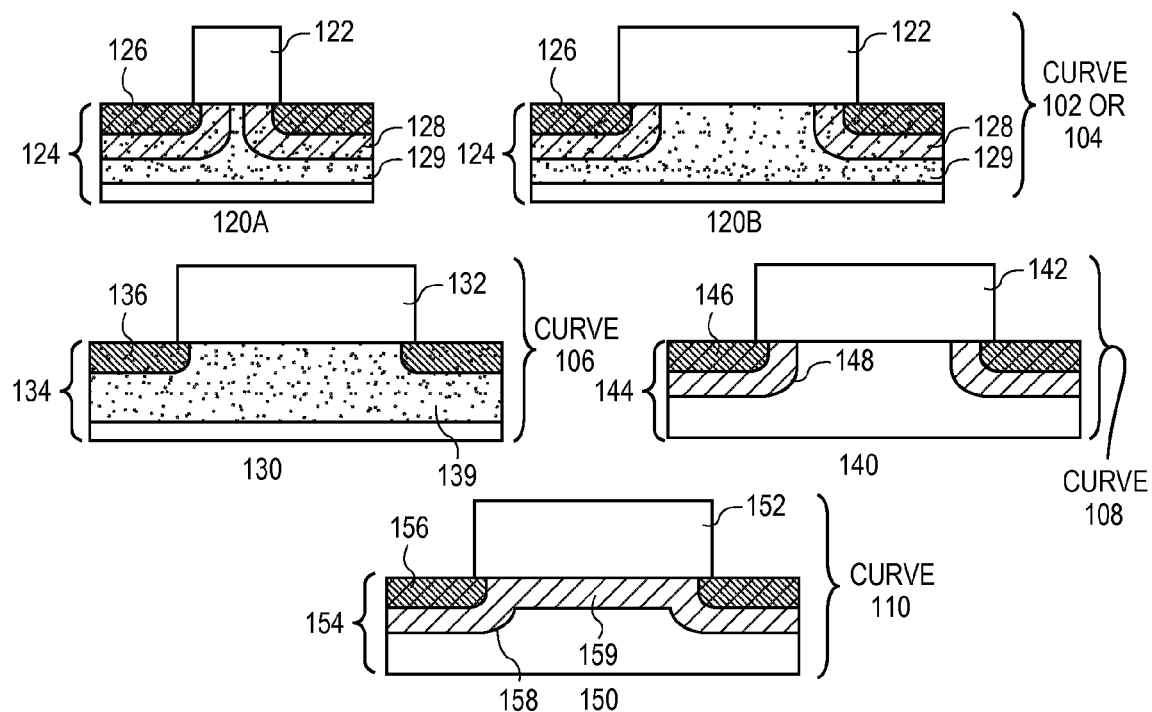

In an aspect of the present invention, an analog device may be fabricated to exclude a well region by instead incorporating a threshold voltage region formed by a penetrating implant process step. For example, FIG. 1 is a plot 100 of Threshold Voltage (Vt) as a function of Gate Length, and cross-sectional views of corresponding representative semiconductor devices, in accordance with an embodiment of the present invention. For clarity, source and drain regions are not depicted in the cross-sectional views of the corresponding representative semiconductor devices.

Referring to FIG. 1, semiconductor devices 120A and 120B are associated with curve 102 of plot 100. Semiconductor device 120A is a short-channel device with a narrow gate stack 122 above a substrate 124 having a well region 129 of a first conductivity type disposed therein. Well region 129 is formed by implanting dopant impurity atoms into substrate 124 prior to the fabrication of gate stack 122. Tip regions 126 of a second conductivity type, opposite the first conductivity type, are formed by implanting dopant impurity atoms into well region 129 of substrate 124 on either side of gate stack 122. Halo regions 128 of the first conductivity type are formed by implanting dopant impurity atoms into substrate 124 subsequent to forming tip regions 126. The implant steps used to form tip regions 126 and halo regions 128 are both non-penetrating because, during these implant steps, gate stack 122 acts as a mask to block the incorporation of dopant impurity atoms into the region of substrate 124 directly underneath gate stack 122. In accordance with an embodiment of the present invention, semiconductor device 120A is characterized as a short-channel device because halo regions 128 nearly or approximately overlap with one another, as depicted in FIG. 1. Semiconductor device 120B is a long-channel device with a wide gate stack 122 above a substrate 124. Similar to semiconductor device 120A, a well region 129, tip regions 126 and halo regions 128 are formed in substrate 124 of semiconductor device 120B.

Referring to curve 102, semiconductor devices 120A and 120B fall at points "x" and "y$_1$", respectively, when operated at a relatively low applied gate voltage, such as a gate voltage appropriate for operating a logic device. By including well region 129 in both semiconductor devices 120A and 120B, the threshold voltage (Vt) drops only minimally with increasing gate length for a range of gate lengths. This trend may be acceptable if both semiconductor devices 120A and 120B are indeed used for logic type applications. However, in accordance with an embodiment of the present invention, short-channel semiconductor device 120A is used for logic applications and long-channel semiconductor device 120B is used for analog applications. Referring to curve 104, semiconductor device 120B falls at point "y$_2$" when operated at a relatively high applied gate voltage such as a gate voltage appropriate for operating an analog device. However, as a result of including both well region 129 and halo regions 128, the threshold voltage may be undesirably high. Furthermore, as the gate length increases, halo regions 128 become further spaced apart, lending to an instable (albeit minimally instable) threshold voltage for a range of gate lengths.

Referring again to FIG. 1, semiconductor device 130 is associated with curve 106 of plot 100. Semiconductor device 130 is a long-channel device with a wide gate stack 132 above a substrate 134 having a well region 139 of a first conductivity type disposed therein. Tip regions 136 of a second conductivity type, opposite the first conductivity type, are formed in substrate 134. In accordance with an embodiment of the present invention, semiconductor device 130 does not include halo regions. Referring to curve 106, by excluding halo regions, the instability of threshold voltages may be mitigated for a range of gate lengths. However, when operated at a relatively high applied gate voltage such as a gate voltage appropriate for operating an analog device, the threshold voltage of semiconductor device 130 may remain undesirably high.

Referring again to FIG. 1, semiconductor device 140 is associated with curve 108 of plot 100. Semiconductor device 140 is a long-channel device with a wide gate stack 142 above a substrate 144. Halo regions 148 of a first conductivity type and tip regions 146 of a second conductivity type, opposite the first conductivity type, are formed in substrate 144. However, in accordance with an embodiment of the present invention, semiconductor device 140 does not include a well region. Referring to curve 108, when operated at a relatively high applied gate voltage such as a gate voltage appropriate for operating an analog device, the threshold voltage of semiconductor device 140 may be acceptable for certain gate lengths. However, by excluding a well region, the instability of threshold voltages becomes unacceptable over a range of gate lengths.

Referring again to FIG. 1, semiconductor device 150 is associated with curve 110 of plot 100. Semiconductor device 150 is a long-channel device with a wide gate stack 152 above a substrate 154. Tip regions 156 are formed by implanting dopant impurity atoms in substrate 154 on either side of gate stack 152. Halo regions 158 and a voltage threshold implant region 159, of a conductivity type opposite the conductivity type of tip regions 156, are formed in substrate 154 subsequent to forming tip regions 156. However, in accordance with an embodiment of the present invention, semiconductor device 150 does not include a well region. The implant step used to form tip regions 126 is non-penetrating because, during this implant step, gate stack 152 acts as a mask to block the incorporation of dopant impurity atoms into the region of substrate 154 directly underneath gate stack 152. However, in accordance with an embodiment of the present invention, the implant step used to form halo regions 158 and voltage threshold implant region 159 is a penetrating implant step because, during this implant step, gate stack 152 permits the incorporation of dopant impurity atoms into the region of substrate 154 directly underneath gate stack 152. Referring to curve 110, when operated at a relatively high applied gate voltage such as a gate voltage appropriate for operating an analog device, the threshold voltage of semiconductor device 150 may be acceptable for certain gate lengths. Additionally, by incorporating voltage threshold implant region 159, the instability of threshold voltages is mitigated for a range of gate lengths with varying spacing between halo regions 158, even though a well region is excluded from semiconductor device 150.

Thus, in an aspect of the present invention, a semiconductor device may be fabricated to include a threshold voltage implant region and to exclude a well region. In a more detailed example, FIG. 2A illustrates a cross-sectional view of a semiconductor device formed with a penetrating implant technique, in accordance with an embodiment of the present invention.

Figure 2A:
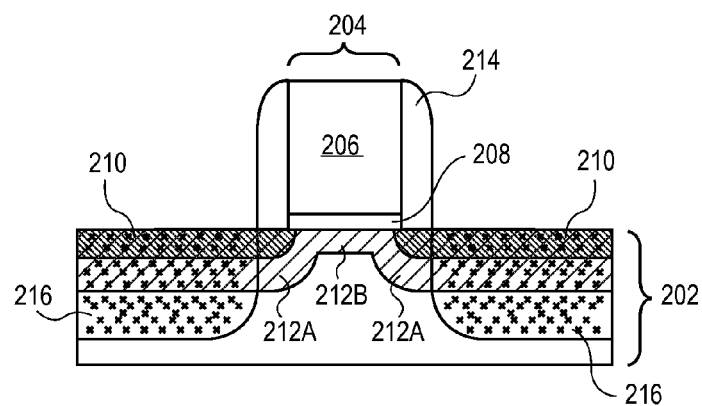
FIG. 2A illustrates a cross-sectional view of a semiconductor device formed with a penetrating implant technique, in accordance with an embodiment of the present invention.

Referring to FIG. 2A, a semiconductor device includes a gate stack 204 disposed on a substrate 202. Tip regions 210 incorporating dopant impurity atoms of a first conductivity type are disposed in the substrate on either side of gate stack 204. Halo regions 212A incorporating dopant impurity atoms of a second conductivity type, opposite the first conductivity type, are disposed in substrate 202 adjacent tip regions 210. A threshold voltage implant region 212B incorporating dopant impurity atoms of the second conductivity type are disposed in substrate 202 directly below gate stack 204. In accordance with an embodiment of the present invention, the concentration of dopant impurity atoms of the second conductivity type in threshold voltage implant region 212B is approximately the same as the concentration of dopant impurity atoms of the second conductivity type in halo regions 212A. In one embodiment, the concentration is approximately the same because threshold voltage implant region 212B and halo regions 212A are formed in the same penetrating implant step.

Substrate 202 may be composed of any material suitable for semiconductor device fabrication. In one embodiment, substrate 202 is a bulk substrate composed of a single crystal of a material which may include, but is not limited to, silicon, germanium, silicon-germanium or a III-V compound semiconductor material. In another embodiment, substrate 202 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 202 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium and a III-V compound semiconductor material. The insulator layer is composed of a material which may include, but is not limited to, silicon dioxide, silicon nitride and silicon oxy-nitride. The lower bulk layer is composed of a single crystal which may include, but is not limited to, silicon, germanium, silicon-germanium, a III-V compound semiconductor material and quartz. Substrate 202 may further include dopant impurity atoms, e.g. substrate 202 may be a global P-type substrate including a relatively low concentration of boron dopant impurity atoms throughout the substrate.

Gate stack 204 may include a gate electrode 206 and a gate dielectric layer 208, as depicted in FIG. 2A. Gate electrode 206 may be composed of any conductor or semiconductor material suitable for accommodating a bias during operation of a semiconductor device. In accordance with an embodiment of the present invention, gate electrode 206 is formed by a chemical vapor deposition process and is composed of doped poly-crystalline silicon. In another embodiment, gate electrode 206 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel. Gate dielectric layer 208 may be composed of any material suitable to electrically isolate gate electrode 206 from substrate 202. In one embodiment, gate dielectric layer 208 is formed by a thermal oxidation process or a chemical vapor deposition process and is composed of a material such as, but not limited to, silicon dioxide or silicon oxy-nitride. In another embodiment, gate dielectric layer 208 is formed by atomic layer deposition and is composed of a high-k dielectric material such as, but not limited to, hafnium oxide, zirconium oxide, hafnium silicate, hafnium oxy-nitride or lanthanum oxide.

The dopant impurity atoms of threshold voltage implant region 212B and halo regions 212A may have a first conductivity type. In one embodiment, the dopant impurity atoms of the first conductivity type include boron dopant impurity atoms and are present in a concentration approximately in the range of $5\times10^{17}$-$5\times10^{18}$ atoms/cm$^3$. In another embodiment, the dopant impurity atoms of the first conductivity type include dopant impurity atoms such as, but not limited to, arsenic or phosphorous and are present in a concentration approximately in the range of $5\times10^{17}$-$5\times10^{18}$ atoms/cm$^3$.

Tip regions 210 may be regions having opposite conductivity to threshold voltage implant region 212B and halo regions 212A. For example, in accordance with an embodiment of the present invention, tip regions 210 are N-type doped regions while threshold voltage implant region 212B and halo regions 212A are P-type doped regions. In one embodiment, tip regions 210 are composed of phosphorous or arsenic dopant impurity atoms with a concentration in the range of $5\times10^{16}$-$5\times10^{19}$ atoms/cm$^3$. In accordance with another embodiment of the present invention, tip regions 210 are P-type doped regions while threshold voltage implant region 212B and halo regions 212A are N-type doped regions. In one embodiment, tip regions 210 are composed of boron dopant impurity atoms with a concentration in the range of $5\times10^{16}$-$5\times10^{19}$ atoms/cm$^3$. Referring again to FIG. 2A, the semiconductor device further includes source and drain regions 216 incorporating dopant impurity atoms of the same conductivity type as tip regions 210. Source and drain regions 216 may be disposed in the substrate on either side of a pair of gate isolation spacers 214, as depicted in FIG. 2A.

Figure 2B:
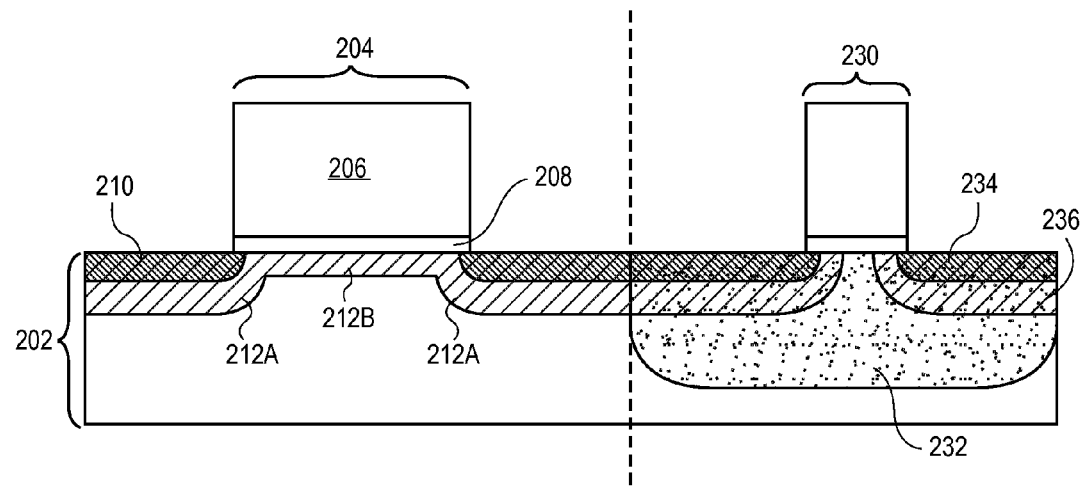
FIG. 2B illustrates a cross-sectional view of a semiconductor device formed with a penetrating implant technique on the same substrate as a semiconductor device formed without a penetrating implant, in accordance with an embodiment of the present invention.

In an aspect of the present invention, a semiconductor device including a threshold voltage implant region, but excluding a well region, may be fabricated on the same substrate as a semiconductor device that includes a well region but excludes a penetrating-implant-formed threshold voltage implant region. FIG. 2B illustrates a cross-sectional view of a semiconductor device formed with a penetrating implant technique on the same substrate as a semiconductor device formed without a penetrating implant, in accordance with an embodiment of the present invention. For clarity, source and drain regions are not depicted in the cross-sectional views of the semiconductor devices depicted in FIG. 2B.

Referring to FIG. 2B, a first portion (left portion in FIG. 2B) of a substrate 202 includes a long-channel device and a second portion (right portion in FIG. 2B) of substrate 202 includes a short-channel device. The long-channel device includes a wide gate stack 204 including a gate electrode 206 and a gate dielectric layer 208. Tip regions 210 are formed in substrate 202 on either side of wide gate stack 204. Halo regions 212A and a threshold voltage implant region 212B are disposed in substrate 202 adjacent tip regions 210 and directly below gate stack 204, respectively. In accordance with an embodiment of the present invention, the concentration of dopant impurity atoms in halo regions 212A and threshold voltage implant region 212B is approximately the same because threshold voltage implant region 212B and halo regions 212A are formed in the same penetrating implant step.

Referring again to FIG. 2B, the short-channel device includes a narrow gate stack 230. Tip regions 234 are formed in well region 232 of substrate 202 on either side of narrow gate stack 230. Halo regions 236 are disposed in substrate 202 adjacent tip regions 234. In accordance with an embodiment of the present invention, the conductivity type of the dopant impurity atoms in halo regions 236 and well region 232 is the same, but the concentration of the dopant impurity atoms in halo regions 236 and well region 232 is not the same because halo regions 236 are formed in an already present well region 232. Although depicted as such in FIG. 2B, neither tip regions 234 nor halo regions 236 need be implanted to the same depth in substrate 202 as tip regions 210 and halo regions 212A, respectively.

The long-channel device and the short-channel device of FIG. 2B may be operated under different conditions. For example, in accordance with an embodiment of the present invention, the long-channel device is an analog device and the short-channel device is a logic device. In one embodiment, the long-channel device has a threshold voltage approximately in the range of 0.5-0.6 Volts and a gate length approximately in the range of 0.16-2 microns and is operated with an applied gate voltage greater than approximately 1.8 Volts, while the short-channel device has a threshold voltage approximately in the range of 0.3-0.35 Volts and a gate length less than approximately 0.1 microns and is operated with an applied gate voltage less than approximately 1.2 Volts.

In an aspect of the present invention, a semiconductor device may be fabricated to exclude a well region but to include a threshold voltage implant region formed with a penetrating implant technique. FIGS. 3A-3F illustrate cross-sectional views representing operations in the formation of a semiconductor device formed with a penetrating implant technique on the same substrate as a semiconductor device formed without a penetrating implant, in accordance with an embodiment of the present invention.

Figure 3A:
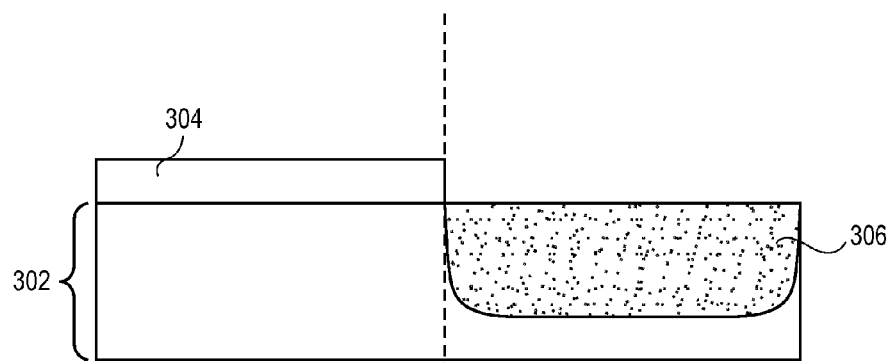
FIGS. 3A-3F illustrate cross-sectional views representing operations in the formation of a semiconductor device formed with a penetrating implant technique on the same substrate as a semiconductor device formed without a penetrating implant, in accordance with an embodiment of the present invention.

Referring to FIG. 3A, a substrate 302 is provided having a first portion (left portion depicted in FIG. 3A) and a second portion (right portion depicted in FIG. 3A), wherein the first portion is well-free and the second portion includes a well region 306 of a first conductivity type. Well region 306 may be formed by masking of the first portion of substrate 302 with a mask layer 304 and implanting dopant impurity atoms into the second, exposed, portion of substrate 302. Substrate 302 may be composed of a material described in association with substrate 202 from FIG. 2A. Well region 306 may be an N-type or a P-type conductivity region having a concentration of dopant impurity atoms approximately in the range of $5 \times 10^{15}$-$5 \times 10^{17}$ atoms/cm$^3$.

Figure 3B:
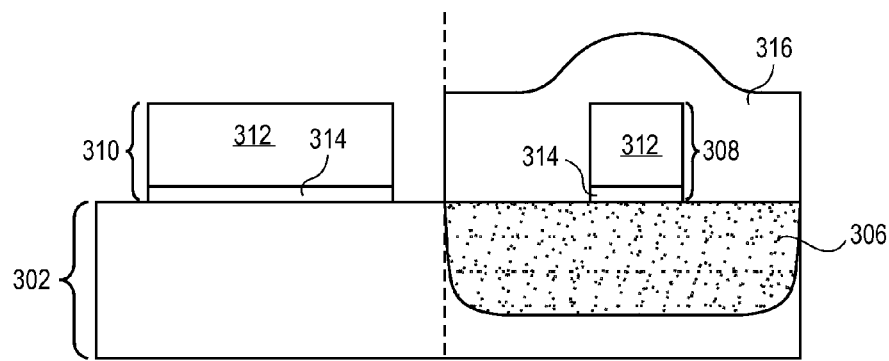

Referring to FIG. 3B, a first gate stack 310 is formed above the first portion of substrate 302 and a second gate stack 308 is formed above well region 306 of the second portion of substrate 302. First gate stack 310 and second gate stack 208 each include a gate electrode 312 and a gate dielectric layer 314. Gate electrode 312 and gate dielectric layer 314 may be composed of materials described in association with gate electrode 206 and gate dielectric layer 208, respectively, from FIG. 2A. Referring again to FIG. 2B, a mask layer 316 is disposed over the second portion of substrate 302, i.e. over gate stack 308, but not over the first portion of substrate 302, i.e. not over first gate stack 310.

Figure 3C:
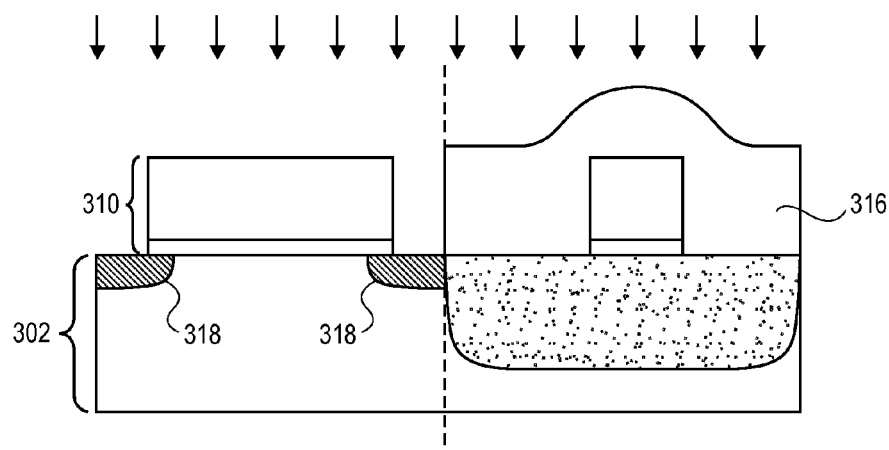

Referring to FIG. 3C, dopant impurity atoms of a second conductivity type, opposite the first conductivity type, are implanted into the first portion of substrate 302 to form tip regions 318 on either side of first gate stack 310. In accordance with an embodiment of the present invention, first gate stack 310 blocks (i.e. does not permit penetration of) the implanting of dopant impurity atoms of the second conductivity type in substrate 302 directly below first gate stack 310 during the formation of tip regions 318. Furthermore, mask layer 316 blocks the implanting of dopant impurity atoms of the second conductivity type into the second portion of substrate 302 during the formation of tip regions 318 in the first portion of substrate 302. Tip regions may include dopant impurity atoms in a concentration described in association with tip regions 210 from FIG. 2A.

Figure 3D:
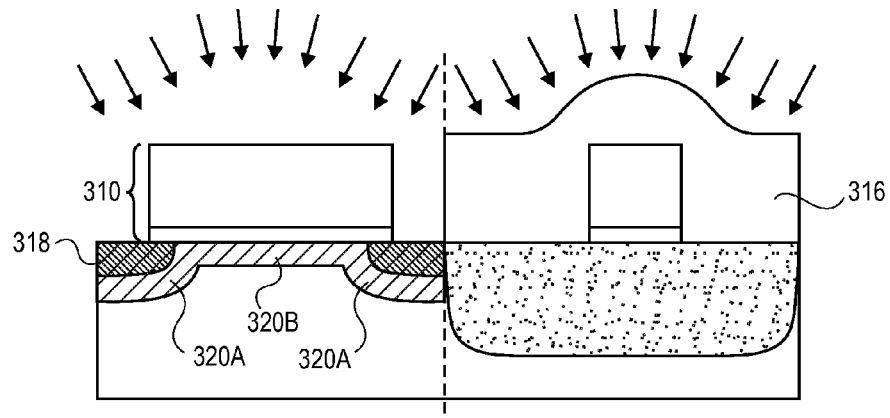

Referring to FIG. 3D, dopant impurity atoms of the first conductivity type are implanted into the first portion of substrate 302 to form halo regions 320A adjacent tip regions 318 and to form a threshold voltage implant region 320B in substrate 302 directly below first gate stack 310. In accordance with an embodiment of the present invention, implanting the dopant impurity atoms of the first conductivity type to form halo regions 320A and threshold voltage implant region 320B includes penetrating first gate stack 310. That is, in one embodiment, the energy of the implanting step is sufficiently high, relative to the thickness of first gate stack 310 and relative to the species being implanted, to penetrate first gate stack 310. Furthermore, mask layer 316 blocks the implanting of dopant impurity atoms of the first conductivity type into the second portion of substrate 302 during the formation of halo regions 320A and threshold voltage implant region 320B in the first portion of substrate 302.

The angle of the implanting of dopant impurity atoms to form halo regions 320A and threshold voltage implant region 320B may be varied, several options for which are depicted by the arrows in FIG. 3D. For example, in accordance with an embodiment of the present invention, implanting dopant impurity atoms of the first conductivity type into substrate 302 to form halo regions 320A and threshold voltage implant region 320B includes implanting at an angle non-normal to the top surface of substrate 302. In one embodiment, the angle is approximately in the range of 10-40 degrees off of normal to the top surface of substrate 302. Alternatively, in an embodiment, the angle is approximately normal to the top surface of substrate 302.

The dopant impurity atoms of the first conductivity type used to form halo regions 320A and threshold voltage implant region 320B may include P-type dopant impurity atoms, such as, but not limited to, boron dopant impurity atoms. In one embodiment, the source of the dopant impurity atoms of the first conductivity type is boron and the implanting is carried out at an energy approximately in the range of 5-20 keV at a dose approximately in the range of $2 \times 10^{12}$-$2 \times 10^{13}$ atoms/cm$^2$ to provide a concentration of boron impurity atoms in halo regions 320A and threshold voltage implant region 320B approximately in the range of $5 \times 10^{17}$-$5 \times 10^{18}$ atoms/cm$^3$. In another embodiment, the source of the dopant impurity atoms of the first conductivity type is BF$_2$ and the implanting is carried out at an energy approximately in the range of 25-100 keV at a dose approximately in the range of $2 \times 10^{12}$-$2 \times 10^{13}$ atoms/cm$^2$ to provide a concentration of boron impurity atoms in halo regions 320A and threshold voltage implant region 320B approximately in the range of $5 \times 10^{17}$-$5 \times 10^{18}$ atoms/cm$^3$.

Alternatively, the dopant impurity atoms of the first conductivity type used to form halo regions 320A and threshold voltage implant region 320B may include N-type dopant impurity atoms, such as, but not limited to, arsenic or phosphorous dopant impurity atoms. In one embodiment, the dopant impurity atoms of the first conductivity type include arsenic dopant impurity atoms and the implanting is carried out at an energy approximately in the range of 100-160 keV at a dose approximately in the range of $2 \times 10^{12}$-$2 \times 10^{13}$ atoms/cm$^2$ to provide a concentration of arsenic impurity atoms in halo regions 320A and threshold voltage implant region 320B approximately in the range of $5 \times 10^{17}$-$5 \times 10^{18}$ atoms/cm$^3$. In another embodiment, the dopant impurity atoms of the first conductivity type include phosphorous dopant impurity atoms and the implanting is carried out at an energy approximately in the range of 50-80 keV at a dose approximately in the range of $2 \times 10^{12}$-$2 \times 10^{13}$ atoms/cm$^2$ to provide a concentration of phosphorous impurity atoms in halo regions 320A and threshold voltage implant region 320B approximately in the range of $5 \times 10^{17}$-$5 \times 10^{18}$ atoms/cm$^3$.

Additionally, but not shown in the Figures, dopant impurity atoms of the second conductivity type may be implanted into substrate 302 to form source and drain regions in substrate 302 on either side of first gate stack 310. In one embodiment, first gate stack 310 blocks the implanting of dopant impurity atoms of the second conductivity type into substrate 302 directly below first gate stack 310 during the formation of the source and drain regions. As described in association with FIG. 2A, gate isolation spacers may be formed adjacent the sidewalls of first gate stack 310 prior to the formation of source and drain regions. Also, anneal steps may be carried out following any of the implant steps described above.

Figure 3E:
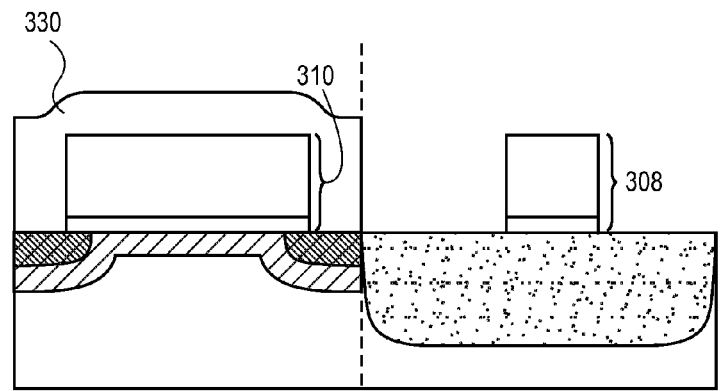
Figure 3F:
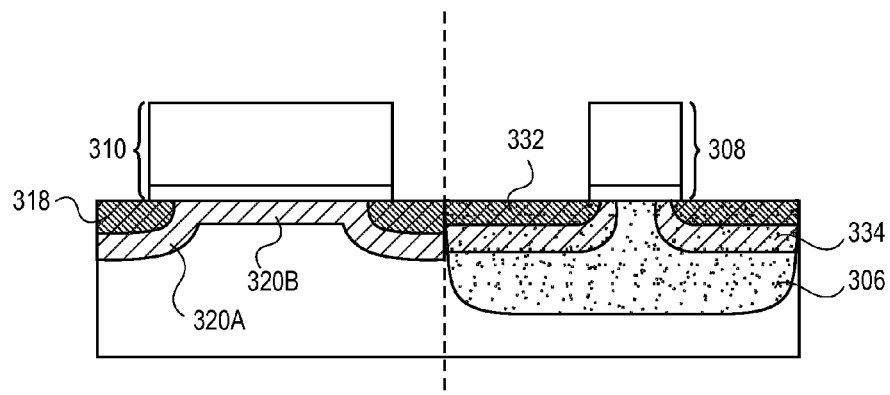

Referring to FIG. 3E, mask layer 316 is removed from above the second gate stack 308 and a second mask layer 330 is disposed over the first portion of substrate 302, i.e. over gate stack 310, but not over the second portion of substrate 302, i.e. not over first gate stack 308. Referring to FIG. 3F, dopant impurity atoms of the second conductivity type are implanted into the second portion of substrate 302 to form a second set of tip regions 332 on either side of second gate stack 308. In an embodiment, second gate stack 308 blocks the implanting of dopant impurity atoms of the second conductivity type directly below second gate stack 308 during the formation of the second set of tip regions 332. Furthermore, second mask layer 330 from FIG. 3E blocks the implanting of dopant impurity atoms of the second conductivity type into the first portion of substrate 302 during the formation of the second set of tip regions 332 in the second portion of substrate 302.

Referring again to FIG. 3F, dopant impurity atoms of the first conductivity type are implanted into the second portion of substrate 302 to form a second set of halo regions 334 adjacent the second set of tip regions 332. In accordance with an embodiment of the present invention, second gate stack 308 blocks the implanting of dopant impurity atoms of the first conductivity type into the second portion of the substrate 302 directly below second gate stack 308 during the formation of the second set of halo regions 334. Furthermore, second mask layer 330 from FIG. 3E blocks the implanting of dopant impurity atoms of the first conductivity type into the first portion of substrate 302 during the formation of the second set of halo regions 334 in the second portion of substrate 302. As depicted in FIG. 3F, neither tip regions 332 nor halo regions 334 need be implanted to the same depth in substrate 302 as tip regions 318 and halo regions 320A, respectively.

Additionally, but not shown in the Figures, with second mask layer 330 still in place, dopant impurity atoms of the second conductivity type may be implanted into the second portion of substrate 302 to form source and drain regions in substrate 302 on either side of second gate stack 308. In one embodiment, second gate stack 308 blocks the implanting of dopant impurity atoms of the second conductivity type into substrate 302 directly below second gate stack 308 during the formation of the source and drain regions. Referring again to FIG. 3F, second mask layer 330 may be removed. Also, anneal steps may be carried out following any of the implant steps described above.

Thus, a semiconductor device and a method to form a semiconductor device have been disclosed. In accordance with an embodiment of the present invention, a gate stack is disposed on a substrate. Tip regions having dopant impurity atoms of a first conductivity type are disposed in the substrate on either side of the gate stack. Halo regions having dopant impurity atoms of a second conductivity type, opposite the first conductivity type, are disposed in the substrate adjacent the tip regions. A threshold voltage implant region having dopant impurity atoms of the second conductivity type is disposed in the substrate directly below the gate stack. In one embodiment, the concentration of dopant impurity atoms of the second conductivity type in the threshold voltage implant region is approximately the same as the concentration of dopant impurity atoms of the second conductivity type in the halo regions. In accordance with an embodiment of the present invention, implanting the dopant impurity atoms of the second conductivity type to form the halo regions and the threshold voltage implant region includes penetrating the gate stack with the dopant impurity atoms of the second conductivity type.

What is claimed is:

1. A method of forming a system-on-a-chip, comprising:
   providing a substrate having a first portion and a second portion, wherein the first portion is well-free and the second portion includes a well region of a first conductivity type;
   forming a first gate stack above the first portion of the substrate and a second gate stack above the well region of the second portion of the substrate;
   forming a mask layer above the second portion of the substrate but not above the first portion of the substrate;
   implanting dopant impurity atoms of a second conductivity type, opposite the first conductivity type, into the first portion of the substrate to form tip regions on either side of the first gate stack, wherein the first gate stack blocks the implanting of dopant impurity atoms of the second conductivity type in the first portion of the substrate directly below the first gate stack during the formation of the tip regions, and wherein the mask layer blocks the implanting of dopant impurity atoms of the second conductivity type in the second portion of the substrate during the formation of the tip regions in the first portion of the substrate; and
   implanting dopant impurity atoms of the first conductivity type into the first portion of the substrate to form halo regions adjacent the tip regions and to form a threshold voltage implant region in the first portion of the substrate directly below the first gate stack, wherein implanting the dopant impurity atoms of the first conductivity type to form halo and threshold voltage implant regions includes penetrating the first gate stack, and wherein the mask layer blocks the implanting of dopant impurity atoms of the first conductivity type in the second portion of the substrate during the formation of the halo and threshold voltage implant regions in the first portion of the substrate.

2. The method of claim 1, wherein implanting dopant impurity atoms of the first conductivity type into the first portion of the substrate to form halo and threshold voltage implant regions includes implanting at an angle approximately in the range of 10-40 degrees off of normal to the substrate.

3. The method of claim 1, wherein the dopant impurity atoms of the first conductivity type include boron dopant impurity atoms, and wherein implanting dopant impurity atoms of the first conductivity type comprises implanting at an energy approximately in the range of 5-100 keV at a dose approximately in the range of $2\times10^{12}$-$2\times10^{13}$ atoms/cm$^2$ to provide a concentration of boron impurity atoms in the halo and threshold voltage implant regions approximately in the range of $5\times10^{17}$-$5\times10^{18}$ atoms/cm$^3$.

4. The method of claim 1, wherein the dopant impurity atoms of the first conductivity type include arsenic dopant impurity atoms, and wherein implanting dopant impurity atoms of the first conductivity type comprises implanting at an energy approximately in the range of 100-160 keV at a dose approximately in the range of $2\times10^{12}$-$2\times10^{13}$ atoms/cm$^2$ to provide a concentration of arsenic impurity atoms in the halo and threshold voltage implant regions approximately in the range of $5\times10^{17}$-$5\times10^{18}$ atoms/cm$^3$.

5. The method of claim 1, wherein the dopant impurity atoms of the first conductivity type include phosphorous dopant impurity atoms, and wherein implanting dopant impurity atoms of the first conductivity type comprises implanting at an energy approximately in the range of 50-80 keV at a dose approximately in the range of $2\times10^{12}$-$2\times10^{13}$ atoms/cm$^2$ to provide a concentration of phosphorous impurity atoms in the halo and threshold voltage implant regions approximately in the range of $5\times10^{17}$-$5\times10^{18}$ atoms/cm$^3$.

6. The method of claim 1, further comprising:
   implanting dopant impurity atoms of the second conductivity type into the first portion of the substrate to form source and drain regions in the substrate on either side of the first gate stack, wherein the first gate stack blocks the implanting of dopant impurity atoms of the second conductivity type in the substrate directly below the first gate stack during the formation of the source and drain regions.

7. The method of claim 1, further comprising:
   removing the mask layer; and
   forming a second mask layer above the first portion of the substrate but not above the second portion of the substrate;

implanting dopant impurity atoms of the second conductivity type into the second portion of the substrate to form a second set of tip regions on either side of the second gate stack, wherein the second gate stack blocks the implanting of dopant impurity atoms of the second conductivity type in the second portion of the substrate directly below the second gate stack during the formation of the second set of tip regions, and wherein the second mask layer blocks the implanting of dopant impurity atoms of the second conductivity type in the first portion of the substrate during the formation of the second set of tip regions in the second portion of the substrate; and implanting dopant impurity atoms of the first conductivity type into the second portion of the substrate to form a second set of halo regions adjacent the second set of tip regions, wherein the second gate stack blocks the implanting of dopant impurity atoms of the first conductivity type in the second portion of the substrate directly below the second gate stack during the formation of the second set of halo regions, and wherein the second mask layer blocks the implanting of dopant impurity atoms of the first conductivity type in the first portion of the substrate during the formation of the second set of halo regions in the second portion of the substrate.

* * * * *